(12) United States Patent
Wang et al.

(10) Patent No.: US 8,531,186 B2
(45) Date of Patent: Sep. 10, 2013

(54) MAGNETIC RESONANCE BODY COIL ASSEMBLY AND METHOD FOR GENERATING RADIO-FREQUENCY FIELD USING THE MAGNETIC RESONANCE BODY COIL ASSEMBLY

(75) Inventors: Jian Min Wang, ShenZhen (CN); Lan Wang, Shenzhen (CN); Yao Xing, Shenzhen (CN); Min Xue, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 462 days.

(21) Appl. No.: 12/842,459

(22) Filed: Jul. 23, 2010

(65) Prior Publication Data

US 2011/0025331 A1 Feb. 3, 2011

(30) Foreign Application Priority Data

Jul. 28, 2009 (CN) .......................... 2009 1 0157417

(51) Int. Cl.
*G01R 33/32* (2006.01)
*G01R 33/341* (2006.01)

(52) U.S. Cl.
USPC ............................ 324/324; 324/318; 324/322

(58) Field of Classification Search
USPC .............. 324/300–322, 76.51; 600/407–435; 382/128–131; 607/103; 455/522; 370/310
See application file for complete search history.

(56) References Cited

U.S. PATENT DOCUMENTS

| | | | | |
|---|---|---|---|---|
| 6,832,097 | B2* | 12/2004 | Aisaka et al. | 455/522 |
| 6,850,497 | B1* | 2/2005 | Sigler et al. | 370/310 |
| 6,989,673 | B2* | 1/2006 | Zhu | 324/318 |
| 7,684,871 | B2* | 3/2010 | Eggers et al. | 607/103 |
| 2002/0137536 | A1* | 9/2002 | Aisaka et al. | 455/522 |
| 2004/0122494 | A1* | 6/2004 | Eggers et al. | 607/103 |
| 2005/0110487 | A1* | 5/2005 | Zhu | 324/309 |
| 2005/0154291 | A1* | 7/2005 | Zhao et al. | 600/410 |
| 2006/0020313 | A1* | 1/2006 | Eggers et al. | 607/103 |
| 2006/0030912 | A1* | 2/2006 | Eggers et al. | 607/103 |
| 2011/0025331 | A1* | 2/2011 | Wang et al. | 324/318 |
| 2011/0156694 | A1* | 6/2011 | de Graauw | 324/76.51 |
| 2012/0062230 | A1* | 3/2012 | Vaughan et al. | 324/318 |
| 2012/0223709 | A1* | 9/2012 | Schillak et al. | 324/309 |

OTHER PUBLICATIONS

U.S. Appl. No. 12/842,121.

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

A body coil assembly for a magnetic resonance apparatus has a first coil and a second coil for generating a radio-frequency field in space, and a power control apparatus connected to the first coil and the second coil for controlling the transmitting power of the first coil and the second coil. In a method for generating a radio-frequency field using such a body coil assembly, the transmitting powers of the first coil and the second coil are controlled, to provide unequal transmitting powers to the first coil and the second coil when needed to generate a required radio-frequency field distribution, so as to form a stronger field strength at a certain position, thus improving the signal to noise ratio at that position during the receiving process.

6 Claims, 3 Drawing Sheets

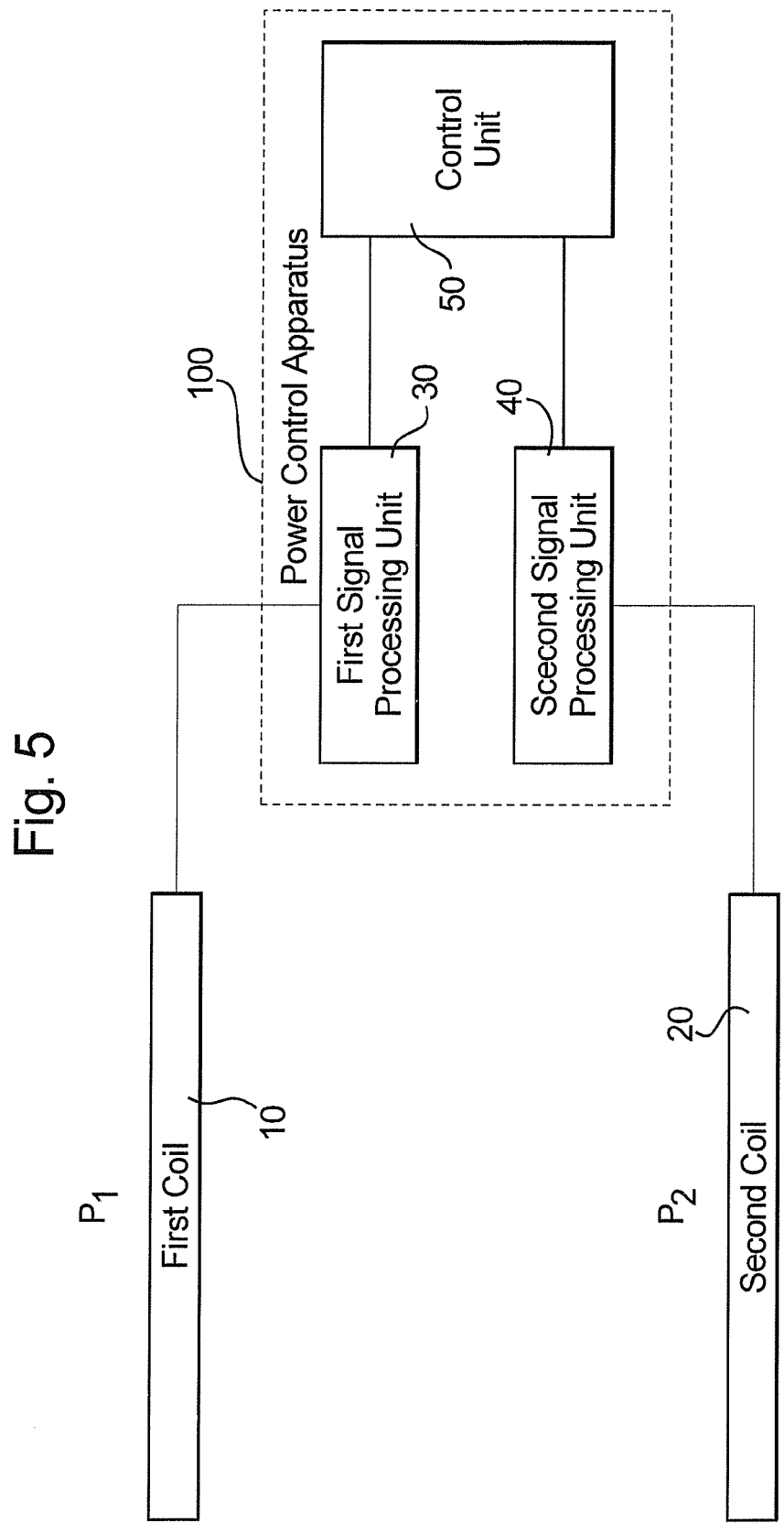

MAGNETIC RESONANCE BODY COIL ASSEMBLY AND METHOD FOR GENERATING RADIO-FREQUENCY FIELD USING THE MAGNETIC RESONANCE BODY COIL ASSEMBLY

BACKGROUND OF THE INVENTION

1. Field of the Invention

The present invention relates to a body coil in the field of magnetic resonance (MR) and, particularly, to a body coil assembly and a method for generating a radio-frequency field by using the body coil assembly.

2. Description of the Prior Art

In magnetic resonance systems employing a vertical magnet (in which the direction of main magnetic field is perpendicular to Z axis), the body coils are divided into two parts disposed oppositely, i.e., they include a first coil 10 and a second coil 20 as shown in FIG. 1, and the distance between the first coil 10 and the second coil 20 is L. If the first coil 10 and the second coil 20, as shown in FIG. 1, are disposed oppositely one above the other, and a patient 5 lies horizontally therebetween, then the first coil 10 and the second coil 20 are referred to respectively as an upper coil and a lower coil. The first coil 10 and the second coil 20 can be arranged differently from that shown in FIG. 1, and in the present invention there is no restriction in this regard. For example, the coils can be arranged oppositely with one to the left and the other right with a patient standing therebetween.

As shown in FIG. 1, in the magnetic resonance system of vertical magnets, since it is necessary for the body coil to generate a uniform radio-frequency field in the enclosed space, the first coil 10 and the second coil 20 are symmetric. In a conventional magnetic resonance system, the transmitting power is fixedly and symmetrically distributed to the first coil 10 and second coil 20, i.e., each of the first coil 10 and the second coil 20 consumes half of the overall transmitting power.

In addition, in order to improve the signal-to-noise ratio of the received signals, a conventional magnetic resonance system generally uses measures for improving the scanning sequence, but such an approach is very complicated to implement and cannot save powers.

SUMMARY OF THE INVENTION

In view of the above, an object of the present invention is to provide a body coil assembly that improves the signal-to-noise ratio received in the magnetic resonance system. The present invention also encompasses a method for generating a radio-frequency field by using the body coil assembly, so as to improve the signal-to-noise ratio received in the magnetic resonance system.

A body coil assembly according to the present invention has:

a first coil and a second coil for generating a radio-frequency field in space, and a power control apparatus connected to the first coil and to the second coil for controlling the respective transmitting powers of the first coil and the second coil.

Preferably, the power control apparatus includes a first signal generating unit for generating a first signal and providing it to the first coil, a second signal generating unit for generating a second signal and providing it to the second coil; and a control unit for controlling the respective powers of the first signal and the second signal.

Preferably, the first signal generating unit is a D/A converter and the second signal generating unit also is a D/A converter.

Preferably, the power control apparatus further includes a first power amplification unit connected between the first signal generating unit and the first coil for amplifying the first signal and a second power amplification unit connected between the second signal generating unit and the second coil for amplifying the second signal.

The present invention also provides a method for generating a radio-frequency field by using the body coil assembly, the body coil assembly including a first coil and a second coil, and the method including determining the transmitting powers of the first coil and the second coil, providing (supplying) the corresponding transmitting powers to the first coil and the second coil, and generating, by the first coil and the second coil, a radio-frequency field in space according to the corresponding transmitting powers.

Preferably, the step of determining the transmitting powers of said first coil and said second coil includes obtaining, by calculation, the transmitting powers of the first coil and the second coil according to the field strength needed at a certain position and the ratio of the field strengths generated by the first coil and the second coil at that position.

Preferably, the step of determining the transmitting powers of the first coil and the second coil includes pre-storing the transmitting powers of the first coil and the second coil, which correspond to the field strength needed at a certain position and the ratio of the field strengths generated by the first coil and the second coil at that position, and looking up the transmitting powers of the first coil and the second coil according to the field strength needed at a certain position and the ratio of the field strengths generated by the first coil and the second coil at that position.

Preferably, the optimum value for the ratio of the field strength generated by the first coil and the second coil at that position is used.

Preferably, the step of providing the corresponding transmitting powers includes generating a first signal and a second signal, in which the first signal has a power equal to the transmitting power of the first coil, and the second signal has a power equal to the transmitting power of the second coil, and providing the first signal to the first coil, and providing the second signal to the second coil.

Preferably, the step of providing the corresponding transmitting powers includes generating a first signal and a second signal, in which the first signal has a power less than the transmitting power of the first coil, and the second signal has a power less than the transmitting power of the second coil, amplifying the power of the first signal to the transmitting power of the first coil, and amplifying the power of the second signal to the transmitting power of the second coil, and providing the amplified first signal to the first coil, and providing the amplified second signal to the second coil.

It can be seen from the abovementioned solutions that, since in the present invention the transmitting powers of the first coil and the second coil are controlled, so as to provide unequal transmitting powers to the first coil and the second coil when needed, a required radio-frequency field distribution is generated to form a stronger field strength at a certain position, thus improving the signal-to-noise ratio of that position during the receiving process. Furthermore, compared with the prior art in which equal powers are used for the first coil and the second coil, the technical solutions of the present invention are capable of reducing the total power transmitted, thereby saving power and reducing the energy consumption.

BRIEF DESCRIPTION OF THE DRAWINGS

FIG. 5 is a schematic diagram of the structure of the body coil assembly according to an embodiment of the present invention.

DESCRIPTION OF THE PREFERRED EMBODIMENTS

According to the antenna theory, the receiving and the transmitting are reciprocal, therefore the transmitting efficiency is equivalent to the sensitivity when receiving, and improving the sensitivity results in improvement to the signal-to-noise ratio.

Figure 1:
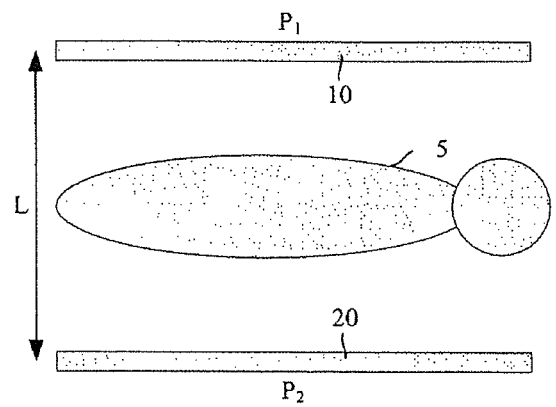
FIG. 1 is a schematic diagram of a known body coil.
Figure 2:
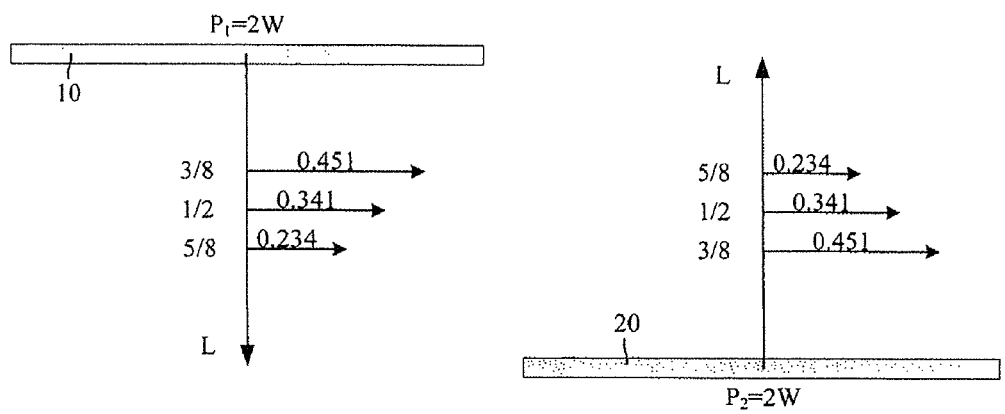
FIGS. 2a and 2b show the field strengths generated at different distances by the first coil and the second coil in the prior art.

In FIG. 2, the field strengths of the first coil 10 and the second coil 20 at different positions in space are indicated schematically.

The equation for calculating the transmitting efficiency is:

$$k = \frac{B}{\sqrt{P}}$$

in which k is the transmission efficiency, B is the magnetic field strength, P is the transmitting power of the first coil or the second coil. It can be seen from the equation that, the transmission efficiency is proportional to the field strength.

As shown in FIG. 2a, the transmitting power of the first coil 10 is 2 W, then the field strength of the first coil 10 is 0.451 at a distance of 3 L/8 from the first coil, 0.341 at an distance of L/2 from the first coil, and 0.234 at a distance of 5 L/8 from the first coil (the values 0.451, 0.341 and 0.234 and so on in the description and the drawings are merely used to denote the magnitude proportion relationships between the field strengths at different positions, rather than accurate values of the field strengths. The same hereinbelow). As shown in FIG. 2b, the transmitting power of the second coil 20 is also 2 W, then the field strength of the second coil 20 is 0.451 at a distance of 3 L/8 from the second coil (a distance of 5 L/8 from the first coil), 0.341 at a distance of L/2 from the second coil (a distance of L/2 from the first coil), and 0.234 at a distance of 5 L/8 from the second coil (a distance of 3 L/8 from the first coil).

According to conventional designs, the transmitting powers are fixedly and equally distributed, when the total transmitting power is 4 W, the transmitting powers of the first coil 10 and the second coil 20 are 2 W each. It should be noted that it is necessary to have the transmitting powers distributed equally to suit the low field magnetic resonance systems (less than 0.5 T) and medium field magnetic resonance systems (0.5 T to 1.0 T). For high field magnetic resonance systems (higher than 1.0 T, especially in the case that the magnetic field strength is greater than or equal to 3 T), since the wavelength is shorter, the standing wave effects of the radio-frequency field in space have a non-uniform distribution, and in such high fields, multi-channel coils are used to transmit asymmetrically, so as to generate uniform radio-frequency fields. Therefore, the present invention is mainly applicable to the low field magnetic resonance systems and the medium field magnetic resonance systems.

Figure 3:
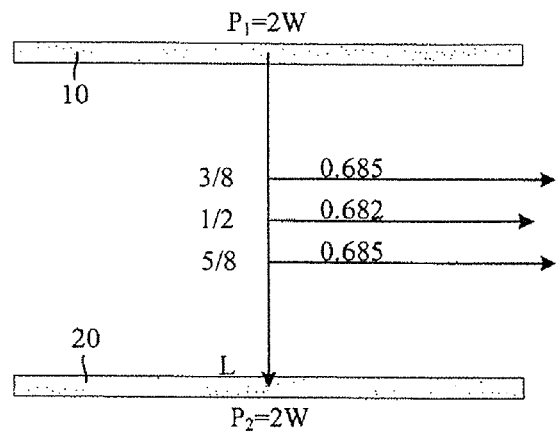
FIG. 3 is a diagram of the field strength distribution generated by a body coil in the prior art.

According to the simulation result shown in FIG. 2, the field strengths at the center of both the first coil 10 and the second coil 20 are 0.682, and 0.685 at the distances of 3 L/8 and 5 L/8 from the first coil, with the results as shown in FIG. 3.

If it is needed to obtain a better signal-to-noise ratio at the distance of 3 L/8 from the first coil when receiving, it can be realized by increasing the transmission efficiency at the position, and the transmission efficiency k is positively proportional to the magnetic field strength B, thus the better signal to noise ratio at this position can be obtained by increasing the magnetic field strength at the position.

According to a self-weighting method of the optimization theory, when it is wanted to have higher field strength at the distance of 3 L/8 from the first coil while keeping the total transmitting power to 4 W, the ratio of transmitting powers can be varied:

$$\frac{P_1}{P_2} = \left(\frac{B_1}{B_2}\right)^2$$

In which $$\left(\frac{B_1}{B_2}\right)$$

represents the ratio between the field strengths generated at the position (a distance of 3 L/8 from the first coil) by the first coil 10 and the second coil 20.

In the case of the structure and the position of the first coil 10 and the second coil 20 being fixed (predetermined), there is an optimum value for the ratio between the field strengths generated by the two coils at the position. The ratio between the field strengths is associated with P1 and P2, and when the total transmitting power P1+P2 is minimal, the corresponding ratio of field strengths is the optimum value.

Furthermore, the total transmitting power of the first coil 10 and the second coil 20 is 4 W, that is, $P_1+P_2=4$, thus it can be worked out that the transmitting power $P_1$ of the first coil 10 is 3.152 W while the transmitting power $P_2$ of the second coil 20 is 0.848 W, then the transmitting power of the first coil and of the second coil are controlled respectively to be $P_1$ and $P_2$, so as to generate the radio-frequency field distribution satisfying the demand, thereby improving the signal-to-noise ratio during the receiving process.

Figure 4:
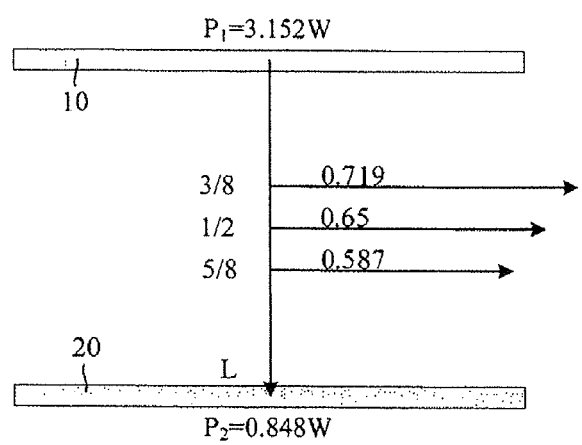
FIG. 4 is a diagram of the field strength distribution generated by the body coil assembly according to an embodiment of the present invention.

As shown in FIG. 4, the field strength at the distance of 3 L/8 from the first coil is:

$$\sqrt{\frac{3.152}{2}} \times 0.451 + \sqrt{\frac{0.848}{2}} \times 0.234 = 0.719$$

The field strength at the distance of L/2 from the first coil is:

$$\sqrt{\frac{3.152}{2}} \times 0.341 + \sqrt{\frac{0.848}{2}} \times 0.341 = 0.65$$

The field strength at the distance of 5 L/8 from the first coil is:

$$\sqrt{\frac{3.152}{2}} \times 0.234 + \sqrt{\frac{0.848}{2}} \times 0.451 = 0.719$$

Therefore, in the case that the total transmitting power (4 W) is kept constant, by comparing FIG. 3 with FIG. 4, the transmitting efficiencies at the positions change as follows:

at the distance of 3 L/8 from the first coil: 0.719/0.685−1=4.9%;

at the distance of L/2 from the first coil: 0.65/0.682−1=−4.69%; and at the distance of 5 L/8 from the first coil: 0.587/0.685−1=−14.2%.

It can be seen that the present invention reduces the efficiencies at the other positions (the distance of L/2 from the first coil, and the distance of 5 L/8 from the first coil), while increasing the efficiency at a certain position (the distance of 3 L/8 from the first coil).

In the particular application situations of low field and medium field magnetic resonance, since it is needed to generate a uniform radio-frequency field in space when transmitting, the equal transmitting powers $P_1$ and $P_2$ are selected when transmitting, i.e., the transmitting powers of the first coil 10 and the second coil 20 are equal. However, when receiving, the image is collected line by line in space. Since the receiving sensitivity and the transmitting efficiency are reciprocal, using unequal transmitting powers for the first coil and second coil can generate the required radio-frequency field distribution and obtain a higher sensitivity at a certain position in space, thereby improving the signal to noise ratio at that position during the receiving process.

For example, by using the unequal transmitting powers $P_1$ and $P_2$ as shown in FIG. 4, the sensitivity at the distance of 3 L/8 from the first coil can be increased by about 5%, correspondingly, the signal to noise ratio at the distance of 3 L/8 from the first coil can be increased by about 5% when receiving.

As shown in FIG. 5, the present invention provides a body coil assembly that has a first coil 10 and a second coil 20, the first coil 10 and the second coil 20 being operated to generate a radio-frequency field in space. The present invention also adds a power control apparatus 100 for the body coil assembly, the power control apparatus 100 is connected to the first coil 10 and the second coil 20 for controlling the transmitting powers $P_1$ and $P_2$ of the first coil 10 and the second coil 20, the unequal transmitting powers $P_1$ and $P_2$ can be used as required, as to how to control then particularly, reference can be made to the description above and hereinafter.

As shown in FIG. 5, the power control apparatus 100 can comprise a first signal generating unit 30, a second signal generating unit 40 and a control unit 50. In this case, the first signal generating unit 30 is connected to the control unit 50 and the first coil 10 for generating a first signal and providing it to the first coil 10. The second signal generating unit 40 is connected to the control unit 50 and the second coil 20 for generating a second signal and providing it to the second coil 20. The control unit 50 is used to control the powers of the first signal and the second signal. The first signal has a power equal to the transmitting power of the first coil, while the second signal has a power equal to the transmitting power of the second coil, and the first coil 10 and the second coil 20 generate radio-frequency fields in space according to the first signal and the second signal, respectively.

Each of the first signal generating unit 30 and the second signal generating unit 40 can be implemented as a D/A converter. In this case, the control unit 50 sends respectively a corresponding digital signal to the first signal generating unit 30 and the second signal generating unit 40 according to the required transmitting powers of the first coil and of the second coil, and the first signal generating unit 30 and the second signal generating unit 40 each converts the corresponding digital signal into an analog signal, thereby generating the first signal and the second signal.

Furthermore, the power control apparatus 100 can also have a first power amplification unit and a second power amplification unit (not shown in the drawings). In this case, the first power amplification unit is connected between the first signal generating unit and the first coil for amplifying the first signal, and the second power amplification unit is connected between the second signal generating unit and the second coil for amplifying the second signal. In this case, the first signal generated by the first signal generating unit 30 has a power less than the transmitting power of the first coil, the second signal generated by the second signal generating unit 40 has a power less than the transmitting power of the second coil, they are then amplified respectively by the first power amplification unit and the second power amplification unit to the transmitting power of the first coil and the transmitting power of the second coil. This can reduce the demand for the signal generating units and the costs.

When the body coil assembly as shown in FIG. 5 is used to generate a radio-frequency field, it does so according to the following steps.

Step 101: The control unit 50 determines the transmitting power $P_1$ of the first coil and the transmitting power $P_2$ of the second coil.

In this step, the transmitting powers of the first coil and the second coil can be obtained by, as described above, calculating according to the field strength required at a certain position and to the ratio between the field strengths generated by the first coil 10 and by the second coil 20 at that position.

In addition, the transmitting powers of the first coil and the second coil can also be obtained by pre-calculating according to the field strength required at a certain position and according to the ratio between the field strengths generated by the first coil 10 and by the second coil 20 at that position. This information is stored in a database. In this step, according to the field strength required at a certain position and to the ratio between the field strengths generated by the first coil 10 and by the second coil 20 at that position, the respective transmitting powers of the first coil and the second coil are looked up from the database.

Here, it is preferable to use the aforementioned optimum value as the ratio between the field strengths generated by the first coil and the second coil at that position. As described above, the optimum value of the ratio between the field strengths refers to the ratio between the field strengths generated by the first coil and by the second coil at that position, which corresponds to the minimal total transmitting power, provided that the field strength at a certain position is kept constant.

Step 102: The control unit 50 controls, according to the obtained transmitting power $P_1$ of the first coil and the transmitting power $P_2$ of the second coil, the powers of the first signal and the second signal generated respectively by the first signal generating unit 30 and the second signal generating unit 40. The first signal generating unit 30 generates the first signal according to the control, and the second signal generating unit 40 generates the second signal according to the control.

When the first signal generating unit 30 and the second signal generating unit 40 uses a D/A converter, the control unit 50 sends a corresponding digital signal to the first signal generating unit 30 and the second signal generating unit 40 according to the required transmitting power of the first coil and the transmitting powers of the second coil. The first signal generating unit 30 and the second signal generating unit 40 each converts the corresponding digital signal into an analog signal, thereby generating the first signal and the second signal.

If the first power amplification unit and the second power amplification unit are not included in the apparatus, the powers of the first signal and of the second signal are respectively equal to the transmitting powers $P_1$ and $P_2$ of the first coil and of the second coil. If the first power amplification unit and the second power amplification unit are included in the apparatus, the powers of the first signal and of the second signal are respectively less than the transmitting powers $P_1$ and $P_2$ of the first coil and the second coil.

Step 103: If the first power amplification unit and the second power amplification unit are included in the apparatus, the first power amplification unit amplifies the first signal and the second power amplification unit amplifies the second signal, making the powers of the first signal and of the second signal up to $P_1$ and $P_2$ respectively.

In this way, the first signal generating unit and the second signal generating unit only need to generate a lower power less than $P_1$ and $P_2$, thereby reducing the demand to the first signal generating unit and the second signal generating unit, which can reduce the costs.

Step 104: The first signal is provided to the first coil 10 and the second signal is provided to the second coil 20.

Step 105: The first coil 10 and the second coil 20 generate radio-frequency fields in space respectively according to the power $P_1$ of the first signal and according to the power $P_2$ of the second signal.

Since the transmitting powers of the first coil 10 and the second coil 20 can be unequal, the required transmission efficiency is formed at the required position in space, thus realizing the required signal to noise ratio when receiving.

Although modifications and changes may be suggested by those skilled in the art, it is the intention of the inventor to embody within the patent warranted hereon all changes and modifications as reasonably and properly come within the scope of his contribution to the art.

We claim:

1. A magnetic resonance body coil assembly, comprising:
a first RF coil and a second RF coil that generate a radio-frequency field in space that excites nuclear spins in a subject in order to produce magnetic resonance data from the subject resulting from the excited nuclear spins;
a power control apparatus connected to said first RF coil and said second RF coil;
said power control apparatus comprising a first signal generating unit that generates a first signal and a first power amplification unit connected between said first signal generating unit and said first RF coil that amplifies said first signal and that provides the amplified first signal to said first RF coil, a second signal generating unit that generates a second signal and a second power amplification unit connected between said second signal generating unit and said second RF coil that amplifies said second signal and provides the amplified second signal to said second RF coil; and
said power control apparatus comprising a control unit configured to control said first and second signal generating units and said first and second power amplification units in order to provide respective individual transmitting powers to said first RF coil and said second RF coil according to a field strength needed at a certain position in said radio-frequency field, and a ratio of the field strengths generated by said first RF coil and said second RF coil at said certain position, said respective individual transmitting powers provided to said first RF coil and said second RF coil causing said first RF coil and said second RF coil to radiate said radio-frequency field.

2. The body coil assembly as claimed in claim 1, wherein said first signal generating unit is a first D/A converter, and said second signal generating unit is a second D/A converter.

3. A method for generating a radio-frequency field in space by using a body coil assembly, said body coil assembly comprising a first RF coil and a second RF coil that generate said radio-frequency field in space that excites nuclear spins in a subject in order to produce magnetic resonance data from the subject resulting from the excited nuclear spins, said method comprising:

in a power control apparatus, generating a first signal with a first signal generating unit and amplifying said first signal with a first power amplification unit connected between said first signal generating unit and said first RF coil and supplying the amplified first signal to said first RF coil;

in said power control apparatus, generating a second signal with a second signal generating unit and amplifying said second signal with a second power amplification unit connected between said second signal generating unit and said second RF coil, and supplying the amplified second signal to said second RF coil;

in a control unit of said power control apparatus, controlling said first and second signal generating units and said first and second power amplification units to provide transmitting powers to said first RF coil and said second RF coil according to a field strength needed at a certain position in a radio-frequency field radiated by said first and second RF coils, and a ratio of the field strengths generated by said first RF coil and said second RF coil at said certain position;

generating, with said first RF coil and said second RF coil, said radio-frequency field in space according to the respective, individual transmitting powers.

4. The method as claimed in claim 3, comprising, in said control unit, determining the transmitting powers of said first RF coil and said second RF coil by calculating the transmitting powers of the first RF coil and the second RF coil according to said field strength needed at said certain position, and said ratio of the field strengths generated by said first RF coil and said second RF coil at said certain position.

5. The method as claimed in claim 3, comprising, in said control unit, determining the transmitting powers of said first RF coil and said second RF coil by pre-storing the transmitting powers of the first RF coil and the second RF coil, which corresponds to the field strength needed at said certain position and the ratio of the field strengths generated by said first RF coil and said second RF coil at that position; looking up for the transmitting powers of the first RF coil and the second RF coil according to the field strength needed at said certain position and the ratio of the field strengths generated by said first RF coil and said second RF coil at said certain position.

6. The method as claimed in claim 3, comprising, in said control unit, determining said ratio as an optimum value for the ratio of the field strength generated by said first RF coil and said second RF coil at said certain position at which a sum of the respective, individual transmitting powers of the first RF and the second RF coil is minimal.

* * * * *